United States Patent
Swift (10) Patent No.: US 10,678,435 B2
(45) Date of Patent: Jun. 9, 2020

(54) DEDUPLICATION AND COMPRESSION OF DATA SEGMENTS IN A DATA STORAGE SYSTEM

(71) Applicant: EMC IP Holding Company LLC, Hopkinton, MA (US)

(72) Inventor: Jeremy Swift, Plymouth, MN (US)

(73) Assignee: EMC IP Holding Company LLC, Hopkinton, MA (US)

( * ) Notice: Subject to any disclaimer, the term of this patent is extended or adjusted under 35 U.S.C. 154(b) by 37 days.

(21) Appl. No.: 15/976,371

(22) Filed: May 10, 2018

(65) Prior Publication Data

US 2018/0329631 A1    Nov. 15, 2018

Related U.S. Application Data

(60) Provisional application No. 62/504,943, filed on May 11, 2017.

(51) Int. Cl.
  *G06F 3/06*    (2006.01)
  *H03M 7/30*   (2006.01)

(52) U.S. Cl.
  CPC ............ *G06F 3/0608* (2013.01); *G06F 3/061* (2013.01); *G06F 3/0641* (2013.01); *G06F 3/0656* (2013.01); *G06F 3/0689* (2013.01); *H03M 7/30* (2013.01); *H03M 7/3091* (2013.01)

(58) Field of Classification Search
  None
  See application file for complete search history.

(56) References Cited

U.S. PATENT DOCUMENTS

| | | | |
|---|---|---|---|
| 9,367,557 B1 | 6/2016 | Lin et al. | |
| 9,411,815 B1 | 8/2016 | Lu et al. | |
| 9,514,146 B1 | 12/2016 | Wallace et al. | |
| 9,767,154 B1 | 9/2017 | Wallace et al. | |
| 9,965,394 B2 | 5/2018 | Romanovskiy | |
| 2012/0089579 A1* | 4/2012 | Ranade | G06F 16/1744 707/693 |
| 2012/0089775 A1* | 4/2012 | Ranade | H03M 7/3091 711/113 |
| 2012/0089781 A1* | 4/2012 | Ranade | H04L 67/1097 711/118 |
| 2017/0123711 A1* | 5/2017 | Kathpal | G06F 3/0641 |

* cited by examiner

*Primary Examiner* — Kevin Verbrugge
(74) *Attorney, Agent, or Firm* — BainwoodHuang (57) ABSTRACT

Techniques for performing data deduplication and compression in data storage systems. Data deduplication is performed in a deduplication domain on a segment-by-segment basis to obtain a plurality of deduplicated data segments. Deduplicated data segments are grouped together to form a plurality of compression groups. Data compression is performed on each compression group, and the compressed group is stored on spinning media. By performing data deduplication on a segment-by-segment basis, the size of each segment can be reduced to increase the effectiveness of data deduplication. By performing data compression on compression groups, the size of each compression domain can be increased to increase the effectiveness of data compression. By storing deduplicated data segments as a compressed group on the spinning media, a sequential nature of the segments can be preserved to reduce a seek time/rotational latency of the spinning media and a number of IOPS handled by the data storage system.

18 Claims, 4 Drawing Sheets

DEDUPLICATION AND COMPRESSION OF DATA SEGMENTS IN A DATA STORAGE SYSTEM

CROSS-REFERENCE TO RELATED APPLICATIONS

This application claims benefit of the priority of U.S. Provisional Patent Application No. 62/504,943 filed May 11, 2017 entitled SYSTEMS AND METHODS OF PERFORMING DATA DEDUPLICATION AND COMPRESSION ON SPINNING MEDIA.

BACKGROUND

Data storage systems typically employ data deduplication and compression techniques to store data more efficiently. In a conventional data storage system, a data stream including a plurality of data segments is received, and a data segment identifier (ID) (e.g., hash value) is generated for each received data segment. The data segment ID is compared with other data segment IDs in an ID index (or ID dictionary). The data segment IDs in the ID dictionary correspond to unique (or deduplicated) data segments within a deduplication domain previously stored by the data storage system. If the data segment ID of the received data segment matches one of the data segment IDs in the ID dictionary, then a check is performed to determine whether or not the received data segment is identical to (or a duplicate of) a previously stored data segment that corresponds to the matching data segment ID. If the received data segment is determined to be a duplicate of a previously stored data segment, then metadata about the received data segment is generated and stored by the data storage system, and the received data segment is removed from the data storage system. If the data segment ID of the received data segment does not match any of the data segment IDs in the ID dictionary, then the received data segment is compressed for storage on the data storage system. Such data compression typically involves searching the entire data segment to be compressed (also referred to herein as the "compression domain") to find any data sequences that are repeated within the data segment, and replacing the repeated data sequences with placeholders that are smaller than the data sequences being replaced.

SUMMARY

There are deficiencies in the above-described conventional data storage system, which performs data deduplication and compression on data segments of a data stream on a "data segment-by-data segment" basis. While performing data deduplication, it is generally beneficial to reduce the size of each data segment to increase the chances of finding duplicate data segments within a deduplication domain, potentially resulting in the removal of a greater number of duplicate data segments from the data storage system. In contrast, while performing data compression, it is generally beneficial to increase the size of each data segment to increase the size of a compression domain, potentially resulting in the replacement of a greater number data sequences within the data segment with smaller placeholders. It is virtually impossible, however, for the conventional data storage system to satisfy, at the same time, such mutually opposing requirements while performing both data deduplication and compression on a data segment-by-data segment basis. Rather, the conventional data storage system may merely opt to employ, at some times, a reduced data segment size to increase the effectiveness of data deduplication, and/or to employ, at other times, an increased data segment size to increase the effectiveness of data compression.

Moreover, while performing data deduplication, fragmentation of a data stream often occurs due to the removal of duplicate data segments from the data storage system. This can be problematic, however, for the conventional data storage system that performs both data deduplication and compression on a data segment-by-data segment basis, particularly while employing spinning media (e.g., hard disk drives (HDD)) for storing the deduplicated and compressed data segments. For example, at least some of the data segments of the data stream may have originally been written together as one write operation to the data storage system. However, following data deduplication and compression, such data segments that were originally written together may have become separated once stored on the spinning media. As a result, as the conventional data storage system attempts to access, in a sequential fashion, the data segments from their separate storage locations on the spinning media, a seek time and/or rotational latency of the spinning media may increase. In addition, while accessing the individual data segments of the data stream from the spinning media, the conventional data storage system may become overwhelmed in terms of handling a high potential number of input/output (IO) operations per second (IOPS).

Improved techniques are disclosed herein for performing data deduplication and compression in data storage systems that can mitigate the mutually opposing requirements of data deduplication and compression, as well as avoid certain drawbacks associated with data stream fragmentation while employing spinning media for data segment storage. In the disclosed techniques, data deduplication of a data stream can be performed in a deduplication domain on a data segment-by-data segment basis to obtain a plurality of unique (or deduplicated) data segments. Having obtained the plurality of deduplicated data segments, a fixed or variable number of the deduplicated data segments can be concatenated (or grouped together) to form a plurality of compression groups. Data compression can then be performed on each compression group as a whole, and the compressed group of deduplicated data segments can be stored on the spinning media.

By performing data deduplication operations on a data segment-by-data segment basis, the size of each data segment can be reduced to increase the effectiveness of the data deduplication in a deduplication domain. Further, by performing data compression operations on groups of deduplicated data segments (rather than individual data segments), the size of each group of data segments to be compressed (each group corresponding to a compression domain) can be increased to increase the effectiveness of the data compression in the compression domain. Moreover, by storing the deduplicated data segments as a compressed group on spinning media, a sequential nature of the deduplicated data segments in the compressed group can be more easily preserved to reduce a seek time and/or rotational latency of the spinning media, as well as reduce a number of IOPS handled by the data storage system while accessing the respective data segments from the spinning media.

In certain embodiments, a method of data deduplication and compression in a data storage system that has a data storage resource includes (i) obtaining a data stream including a plurality of data slices, (ii) performing a data deduplication operation on the plurality of data slices to obtain a plurality of deduplicated data slices, (iii) grouping the plurality of deduplicated data slices to form at least one compression group, (iv) performing a data compression operation on the at least one compression group to obtain at least one compressed group of deduplicated data slices, and (v) storing the at least one compressed group of deduplicated data slices on the data storage resource.

In certain aspects, the method includes slicing the data stream into the plurality of data slices. The plurality of data slices include a plurality of fixed-length data slices. The method further includes performing the data deduplication operation on the plurality of fixed-length data slices to obtain a plurality of fixed-length deduplicated data slices, and grouping the plurality of fixed-length deduplicated data slices to form a plurality of fixed-length compression groups.

In certain further aspects, the method includes slicing the data stream into the plurality of data slices, in which the plurality of data slices include a plurality of variable-length data slices. The method further includes performing the data deduplication operation on the plurality of variable-length data slices to obtain a plurality of variable-length deduplicated data slices, and grouping the plurality of variable-length deduplicated data slices to form a plurality of variable-length compression groups.

In certain further aspects, the method includes generating a metadata map that represents relationships between (i) a plurality of data slice indices for the plurality of deduplicated data slices, respectively, and (ii) at least one compression group identifier for the at least one compression group. The plurality of data slice indices point to locations within the at least one compression group where the plurality of deduplicated data slices reside.

In certain further aspects, the method includes performing at least the data deduplication operation in an in-line fashion as the data stream including the plurality of data slices is being obtained. Having performed at least the data deduplication operation in the in-line fashion, the method further includes performing a background process, including (i) obtaining the deduplicated data slices, (ii) performing a second data deduplication operation on the plurality of deduplicated data slices to obtain a second plurality of deduplicated data slices, (iii) grouping the second plurality of deduplicated data slices to form at least one second compression group, (iv) performing a second data compression operation on the at least one second compression group to obtain at least one second compressed group of deduplicated data slices, and (v) storing the at least one second compressed group of deduplicated data slices on the data storage resource.

In certain further embodiments, a data storage system includes a data storage resource, a memory, and a processor configured to execute instructions out of the memory (i) to obtain a data stream including a plurality of data slices, (ii) to perform a data deduplication operation on the plurality of data slices to obtain a plurality of deduplicated data slices, (iii) to group the plurality of deduplicated data slices to form at least one compression group, (iv) to perform a data compression operation on the at least one compression group to obtain at least one compressed group of deduplicated data slices, and (v) to store the at least one compressed group of deduplicated data slices on the data storage resource.

In certain aspects, the processor is configured to execute the instructions out of the memory (i) to slice the data stream into the plurality of data slices, wherein the plurality of data slices include a plurality of fixed-length data slices, (ii) to perform the data deduplication operation on the plurality of fixed-length data slices to obtain a plurality of fixed-length deduplicated data slices, and (iii) to group the plurality of fixed-length deduplicated data slices to form a plurality of fixed-length compression groups.

In certain further aspects, the processor is configured to execute the instructions out of the memory (i) to slice the data stream into the plurality of data slices, wherein the plurality of data slices include a plurality of variable-length data slices, (ii) to perform the data deduplication operation on the plurality of variable-length data slices to obtain a plurality of variable-length deduplicated data slices, and (iii) to group the plurality of variable-length deduplicated data slices to form a plurality of variable-length compression groups.

In certain further aspects, the processor is configured to execute the instructions out of the memory to generate a metadata map that represents relationships between (i) a plurality of data slice indices for the plurality of deduplicated data slices, respectively, and (ii) at least one compression group identifier for the at least one compression group, wherein the plurality of data slice indices point to locations within the at least one compression group where the plurality of deduplicated data slices reside.

Other features, functions, and aspects of the disclosed system and method will be evident from the Detailed Description that follows.

BRIEF DESCRIPTION OF THE DRAWINGS

The foregoing and other objects, features, and advantages will be apparent from the following description of particular embodiments of the disclosed system and method, as illustrated in the accompanying drawings, in which like reference characters refer to the same parts throughout the different views.

DETAILED DESCRIPTION

U.S. Provisional Patent Application No. 62/504,943 filed May 11, 2017 entitled SYSTEMS AND METHODS OF PERFORMING DATA DEDUPLICATION AND COMPRESSION ON SPINNING MEDIA is hereby incorporated herein by reference in its entirety.

Improved techniques are disclosed herein for performing data deduplication and compression in data storage systems. In the disclosed techniques, data deduplication of a data stream can be performed in a deduplication domain on a "data segment-by-data segment" basis to obtain a plurality of unique (or deduplicated) data segments. Having obtained the plurality of deduplicated data segments, a fixed or variable number of the deduplicated data segments can be concatenated (or grouped together) to form a plurality of compression groups. Data compression can then be performed on each compression group as a whole, and, once compressed, the compression group can be stored on spinning media. By performing data deduplication operations on a data segment-by-data segment basis, the size of each data segment can be reduced to increase the effectiveness of the data deduplication in a deduplication domain. Further, by performing data compression operations on compression groups, the size of each compression group (or compression domain) can be increased to increase the effectiveness of the data compression in the compression domain. Moreover, by storing the deduplicated data segments as a compressed group on spinning media, a sequential nature of the deduplicated data segments can more easily be preserved to reduce a seek time and/or rotational latency of the spinning media, as well as reduce a number of input/output (IO) operations per second (IOPS) handled by the data storage system while accessing the respective data segments from the spinning media.

Figure 1:
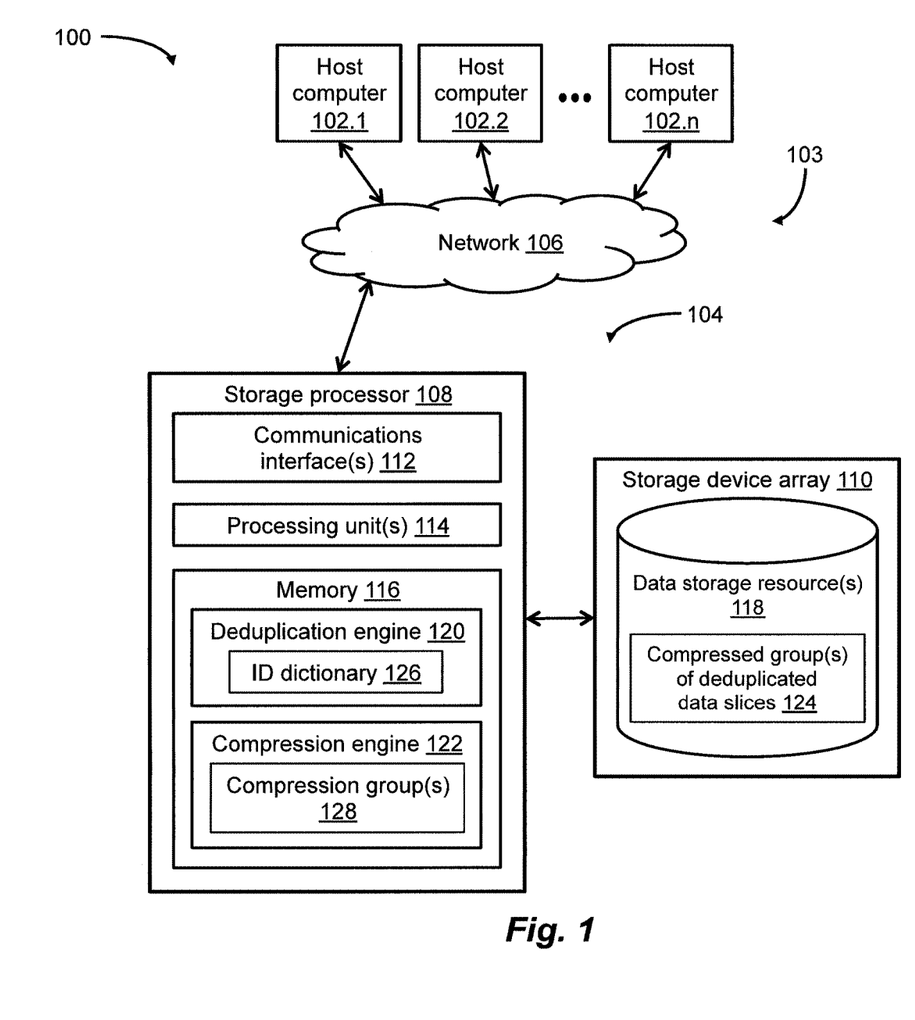
FIG. 1 is a block diagram of a data storage environment, in which an exemplary data storage system configured to perform improved techniques of data deduplication and compression can be employed.

FIG. 1 depicts an illustrative embodiment of a data storage environment 100, in which an exemplary data storage system 104 configured to perform the disclosed techniques of data deduplication and compression can be employed. As shown in FIG. 1, the data storage environment 100 can include a plurality of host computers 102.1, 102.2, ..., 102.n communicably coupled to the data storage system 104 by a communications medium 103 that includes a network 106. For example, each of the plurality of host computers 102.1, ..., 102.n may be configured as a web server computer, a file server computer, an email server computer, an enterprise server computer, a database server computer, and/or any other suitable client or server computer, for providing input/output (IO) requests (e.g., small computer system interface (SCSI) commands, network file system (NFS) commands, common Internet file services (CIFS) commands) to the data storage system 104 over the communications medium 103. Such IO requests (e.g., write requests, read requests) provided by the plurality of host computers 102.1, ..., 102.n can direct the data storage system 104 to store/retrieve data blocks and/or files to/from data storage resources (e.g., logical unit numbers (LUNs), virtual volumes (VVOLs), file systems) on behalf of the respective host computers 102.1, ..., 102.n. The data storage system 104 can be configured to process such IO requests from one or more of the host computers 102.1, ..., 102.n, and store host data in a redundant array of independent disk (RAID) environment implemented by a storage device array 110. In certain embodiments, the data storage system 104 can be configured to store the host data in a cloud-based storage environment, or any other suitable data storage environment.

The communications medium 103 can be configured to interconnect the plurality of host computers 102.1, 102.2, ..., 102.n with the data storage system 104 to enable them to communicate and exchange electronic and/or optical signals. As shown in FIG. 1, at least a portion of the communications medium 103 is illustrated as a "cloud" to indicate that the communications medium 103 can have a variety of different topologies including, but not limited to, backbone, hub-and-spoke, loop, irregular, or any suitable combination thereof. The communications medium 103 can also include, but is not limited to, copper-based data communications devices and cabling, fiber optic devices and cabling, wireless devices, or any suitable combination thereof. In addition, the communications medium 103 can be configured to support storage area network (SAN)-based communications, local area network (LAN)-based communications, cellular communications, wide area network (WAN)-based communications, distributed infrastructure communications, and/or any other suitable communications.

As shown in FIG. 1, the data storage system 104 can include a storage processor 108 and the storage device array 110. The storage processor 108 can include one or more communications interfaces 112, one or more processing units 114, and at least one memory 116. For example, each communications interface 112 may include an adapter, such as a SCSI target adapter and/or network interface adapter, for converting electronic and/or optical signals received over the network 106 to electronic form for use by the storage processor 108. Further, each processing unit 114 may include one or more processing chips and/or assemblies, including, for example, one or more multi-core central processing units (CPUs). The memory 116 may include volatile memory (e.g., random access memory (RAM)) and non-volatile memory (e.g., read-only memory (ROM), disk drive(s), solid-state drive(s) (SSDs)).

The processing unit(s) 114 and the memory 116 in combination form control circuitry that can be configured to perform the methods and/or operations described herein. For example, the memory 116 may include a variety of software constructs including a deduplication engine 120 and a compression engine 122, each of which can be realized in the form of executable instructions. When executed by the processing unit(s) 114, the instructions can cause the processing unit(s) 114 to carry out the methods and/or operations specified by the software constructs. Although certain software constructs are described herein for performing data deduplication and compression operations, it is noted that the memory 116 may also include other useful software constructs, including, but not limited to, operating systems, applications, processes, and/or daemons.

As shown in FIG. 1, the memory 116 can maintain, in association with the deduplication engine 120, a deduplication database that includes at least one data segment (or slice) identifier (ID) index (also referred to herein as the "ID dictionary") 126 for at least one deduplication domain. As employed herein, the term "deduplication domain" refers to one or more data storage resources (e.g., data storage resource(s) 118; see FIG. 1) sharing a common set of data (e.g., data segments or slices) that can be deduplicated together. For example, such a deduplication domain may contain one or more petabytes of data, or any other suitable amount of data. The memory 116 can also at least temporarily maintain, in association with the compression engine 122, one or more compression groups 128, each of which can correspond to a compression domain. For example, such a compression domain may contain several kilobytes of data, or any other suitable amount of data. As further shown in FIG. 1, the storage device array 110 can include the data storage resource(s) 118, which, for example, may be implemented as solid-state drive(s) (SSDs), hard disk drive(s) (HDDs), or any other suitable storage resource(s). Once the data storage system 104 performs data deduplication and compression of a data stream, the storage device array 110 can maintain, on the data storage resource(s) 118, one or more compressed groups of deduplicated data segments 124 for one or more corresponding compression domains.

During operation, the data storage system 104 can mitigate mutually opposing requirements of performing data deduplication and compression of a data stream, as well as avoid certain drawbacks associated with fragmentation of the data stream while employing spinning media (e.g., HDDs) for data segment storage. To those ends, the data storage system 104 can perform data deduplication in a deduplication domain on a data segment-by-data segment basis to obtain a plurality of unique (or deduplicated) data segments. Having obtained the plurality of deduplicated data segments, the data storage system 104 can concatenate (or group together) a fixed or variable number of the deduplicated data segments to form a plurality of compression groups. The data storage system 104 can then perform data compression on each compression group as a whole, and store the compressed group of deduplicated data segments on the data storage resource(s) 118, which can be implemented as spinning media such as one or more HDDs.

By performing data deduplication operations on a data segment-by-data segment basis, the data storage system 104 can employ as reduced size of each data segment to increase the effectiveness of the data deduplication in a deduplication domain. Further, by performing data compression operations on compression groups (rather than individual data segments), the data storage system 104 can employ an increased size of each compression group to increase the effectiveness of the data compression in a compression domain. Moreover, while storing the deduplicated data segments as a compressed group on the data storage resource(s) 118 implemented as spinning media (e.g., HDD(s)), a sequential nature of the deduplicated data segments in the compressed group can be more easily preserved to reduce a seek time and/or rotational latency of the data storage resource(s) 118, as well as reduce a number of IOPS handled by the data storage system 104 while accessing the respective data segments from the data storage resource(s) 118.

Figure 2:
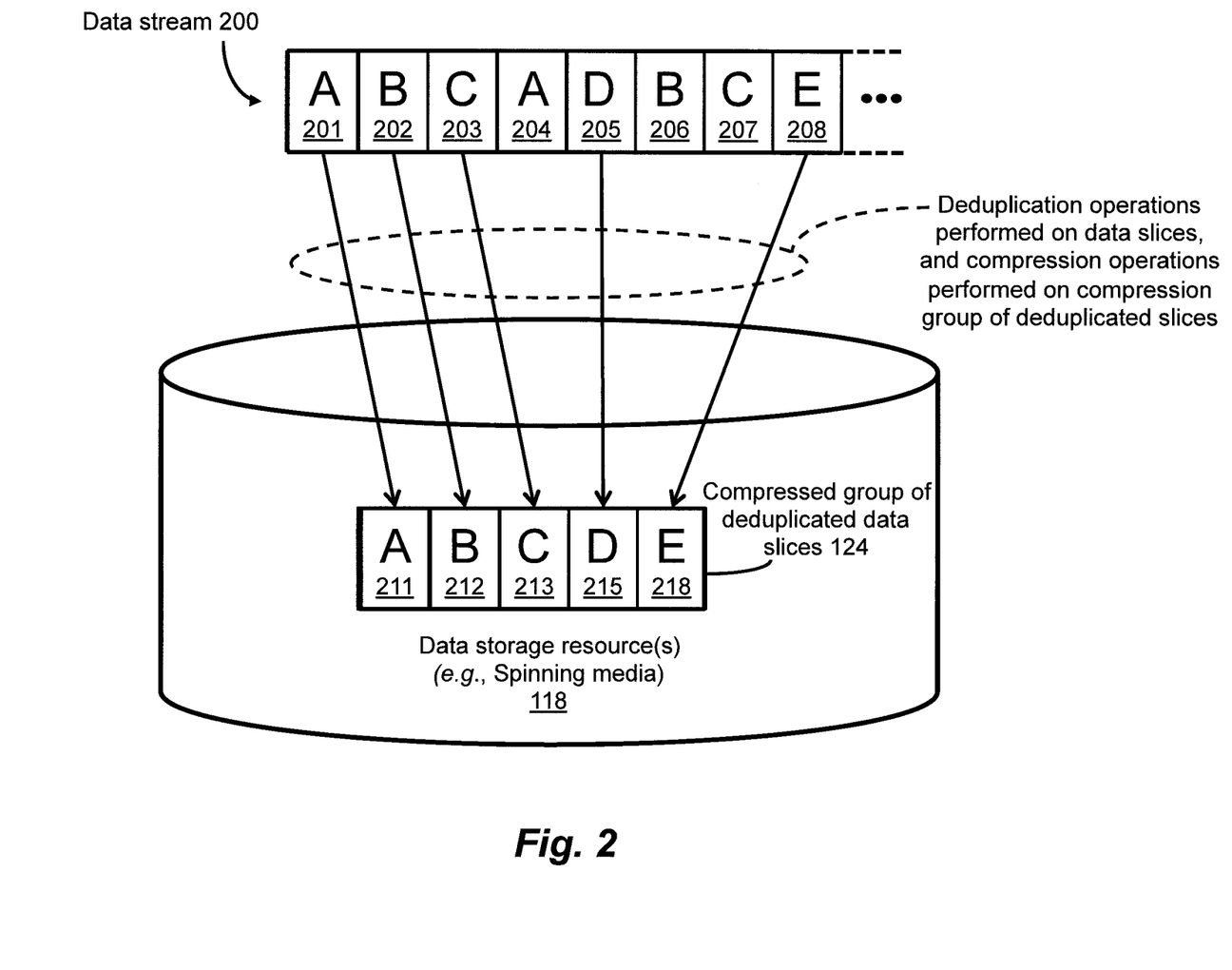
FIG. 2 is a diagram of an exemplary data stream received at the data storage system of FIG. 1, in which the data stream is sliced into a plurality of data segments (or slices) that are operated on to form a compressed group of deduplicated data slices.

The operation of the data storage system 104 (see FIG. 1) will be further described herein with reference to the following illustrative example. In this example, the data storage resource(s) 118 of the storage device array 110 are implemented as spinning media (e.g., HDD(s)). It is noted, however, that the data storage resource(s) 118 can alternatively be implemented as any other suitable data storage resource(s). Further, in this example, the storage processor 108 of the data storage system 104 receives, over the network 106, a data stream from one of the host computers 102.1, . . . , or 102.n. FIG. 2 depicts an exemplary data stream 200, which, for example, may be sent by the host computer 102.1, . . . , or 102.n to the storage processor 108 in one or more write requests, directing the storage processor 108 to store at least a portion of the data stream 200 on the data storage resource(s) 118 of the storage device array 110.

Having received and/or stored the data stream 200, the storage processor 108 executes the deduplication engine 120, effectively slicing the data stream 200 into a plurality of data segments (or slices) such as data slices A 201, B 202, C 203, A 204, D 205, B 206, C 207, E 208, . . . (see FIG. 2). For example, the data storage system 104 may be configured as a page-based storage system, and the data stream 200 may include at least a page of data having a number of data blocks in sequential logical block address (LBA) order. Further, each data slice A 201, B 202, C 203, A 204, D 205, B 206, C 207, E 208 of the data stream 200 may correspond to a single data block, a fraction of a data block, multiple data blocks, or any other suitable fraction or number of the data blocks within the page of data. The storage processor 108 further executes the deduplication engine 120 to generate, within the context of the page of data, a data slice ID for each of the data slices A 201, B 202, C 203, A 204, D 205, B 206, C 207, E 208. For example, each data slice ID may be generated using a fingerprint function, a hash function, a digital signature, or any other suitable function or signature.

It is noted that, in the data stream 200 (see FIG. 2), the data slice A 204 is a duplicate of the data slice A 201, the data slice B 206 is a duplicate of the data slice B 202, and the data slice C 207 is a duplicate of the data slice C 203. Accordingly, the deduplication engine 120 is executed to generate (i) a data slice ID for the data slice A 201, (ii) a data slice ID for the data slice B 202, (iii) a data slice ID for the data slice C 203, (iv) a data slice ID for the data slice A 204 that is identical to the data slice ID for the data slice A 201, (v) a data slice ID for the data slice D 205, (vi) a data slice ID for the data slice B 206 that is identical to the data slice ID for the data slice B 202, (vii) a data slice ID for the data slice C 207 that is identical to the data slice ID for the data slice C 203, and (viii) a data slice ID for the data slice E 208.

The storage processor 108 still further executes the deduplication engine 120 to determine, using the generated data slice IDs, whether any of the data slices A 201, B 202, C 203, A 204, D 205, B 206, C 207, E 208 are duplicates of any other data slices previously stored by the data storage system 104. To that end, the deduplication engine 120 is executed to compare the data slice IDs for the respective data slices A 201, B 202, C 203, A 204, D 205, B 206, C 207, E 208 with zero, one, or more other data slice IDs in the ID dictionary 126, which can correspond to a particular deduplication domain of the data storage system 104. For example, the deduplication engine 120 may be executed to compare the data slice ID for the data slice A 201 with zero, one, or more other data slice IDs in the ID dictionary 126, to determine that the data slice ID for the data slice A 201 does not match any data slice ID in the ID dictionary 126, and to incorporate the data slice ID for the data slice A 201 in the ID dictionary 126. Similarly, the deduplication engine 120 may be executed to compare the data slice IDs for the respective data slices B 202, C 203 with one or more other data slice IDs in the ID dictionary 126, to determine that the data slice IDs for the respective data slices B 202, C 203 do not match any data slice IDs in the ID dictionary 126, and to incorporate the data slice IDs for the respective data slices B 202, C 203 in the ID dictionary 126.

The deduplication engine 120 may also be executed to compare the data slice ID for the data slice A 204 with one or more other data slice IDs in the ID dictionary 126, and to determine that the data slice ID for the data slice A 204 matches the data slice ID for the data slice A 201. Having determined that the data slice IDs for the respective data slices A 201, A 204 match one another, the deduplication engine 120 may perform a check to confirm that the data slices A 201, A 204 are indeed duplicates, and, if so, generate and store metadata about the duplicate data slice A 204, and remove the duplicate data slice A 204 from the data storage system 104. For example, such metadata about the duplicate data slice A 204 may include at least the data slice ID for the data slice A 204, a reference to the data slice A 201, and a data slice index pointing to a location of the duplicate data slice A 204 in the data stream 200. The deduplication engine 120 may also be executed to compare the data slice ID for the data slice D 205 with one or more other data slice IDs in the ID dictionary 126, to determine that the data slice ID for the data slice D 205 does not match any data slice ID in the ID dictionary 126, and to incorporate the data slice ID for the data slice D 205 in the ID dictionary 126.

In addition, the deduplication engine 120 may be executed to compare the data slice ID for the data slice B 206 with one or more other data slice IDs in the ID dictionary 126, and to determine that the data slice ID for the data slice B 206 matches the data slice ID for the data slice B 202. Having determined that the data slice IDs for the respective data slices B 202, B 206 match one another, the deduplication engine 120 may perform a check to confirm that the data slices B 202, B 206 are indeed duplicates, and, if so, generate and store metadata about the duplicate data slice B 206, and remove the duplicate data slice B 206 from the data storage system 104. For example, such metadata about the duplicate data slice B 206 may include at least the data slice ID for the data slice B 206, a reference to the data slice B 202, and a data slice index pointing to a location of the duplicate data slice B 206 in the data stream 200.

Similarly, the deduplication engine 120 may be executed to compare the data slice ID for the data slice C 207 with one or more other data slice IDs in the ID dictionary 126, and to determine that the data slice ID for the data slice C 207 matches the data slice ID for the data slice C 203. Having determined that the data slice IDs for the respective data slices C 203, C 207 match one another, the deduplication engine 120 may perform a check to confirm that the data slices C 203, C 207 are indeed duplicates, and, if so, generate and store metadata about the duplicate data slice C 207, and remove the duplicate data slice C 207 from the data storage system 104. For example, such metadata about the duplicate data slice C 207 may include at least the data slice ID for the data slice C 207, a reference to the data slice C 203, and a data slice index pointing to a location of the duplicate data slice C 207 in the data stream 200.

The deduplication engine 120 may be further executed to compare the data slice ID for the data slice E 208 with one or more other data slice IDs in the ID dictionary 126, to determine that the data slice ID for the data slice E 208 does not match any data slice ID in the ID dictionary 126, and to incorporate the data slice ID for the data slice E 208 in the ID dictionary 126. In addition, the deduplication engine 120 may perform one or more additional comparisons of data slice IDs for any remaining data slices in the data stream 200 (if any), until a plurality of unique (or deduplicated) data slices (i.e., data slices that are not duplicates of any previously received and/or stored data slices) are obtained. For the data stream 200 (see FIG. 2), such a plurality of deduplicated data slices can include at least the data slices A 201, B 202, C 203, D 205, and E 208. Additional discussion relating to applying deduplication techniques to data of a deduplication domain can be found in U.S. Pat. No. 9,449,011 issued Sep. 20, 2016 entitled MANAGING DATA DEDUPLICATION IN STORAGE SYSTEMS, the disclosure of which is hereby incorporated herein by reference in its entirety.

Having obtained the plurality of deduplicated data slices A 201, B 202, C 203, D 205, and E 208, the storage processor 108 executes the compression engine 122 to concatenate (or group together) the deduplicated data slices A 201, B 202, C 203, D 205, and E 208 to form the compression group 128. For example, such a compression group may include a predetermined fixed or variable number of deduplicated data slices. In one embodiment, the compression group can contain from 32 to 64 kilobytes (kb) of data, or any other suitable amount of data. The storage processor 108 further executes the compression engine 122 to compress the compression group 128 containing the deduplicated data slices A 201, B 202, C 203, D 205, E 208 as a whole for storage of the compressed group of deduplicated data slices 124 in the data storage resource(s) 118, which can include one or more HDDs or other spinning media. For example, such compression of the compression group 128 may involve searching the entire compression group 128 to be compressed (also referred to herein as the "compression domain") to find any data sequences that are repeated within the compression group 128, and replacing the repeated data sequences with placeholders that are smaller than the data sequences being replaced. Additional discussion relating to data compression in data storage systems can be found in U.S. Pat. No. 9,355,112 issued May 31, 2016 entitled OPTIMIZING COMPRESSION BASED ON DATA ACTIVITY, the disclosure of which is hereby incorporated herein by reference in its entirety.

To facilitate tracking of the plurality of deduplicated data slices A 201, B 202, C 203, D 205, E 208 within the compression group 128, the storage processor 108 can execute the compression engine 122 to generate a compression group ID for the compression group 128, and a data slice index for each deduplicated data slice A 201, B 202, C 203, D 205, E 208 in the compression group 128. The storage processor 108 can further execute the compression engine 122 to generate and store a metadata map that represents relationships between the data slice indices of the respective deduplicated data slices A 201, B 202, C 203, D 205, E 208, and the compression group ID of the compression group 128 to which the respective deduplicated data slices belong.

Figure 3A:
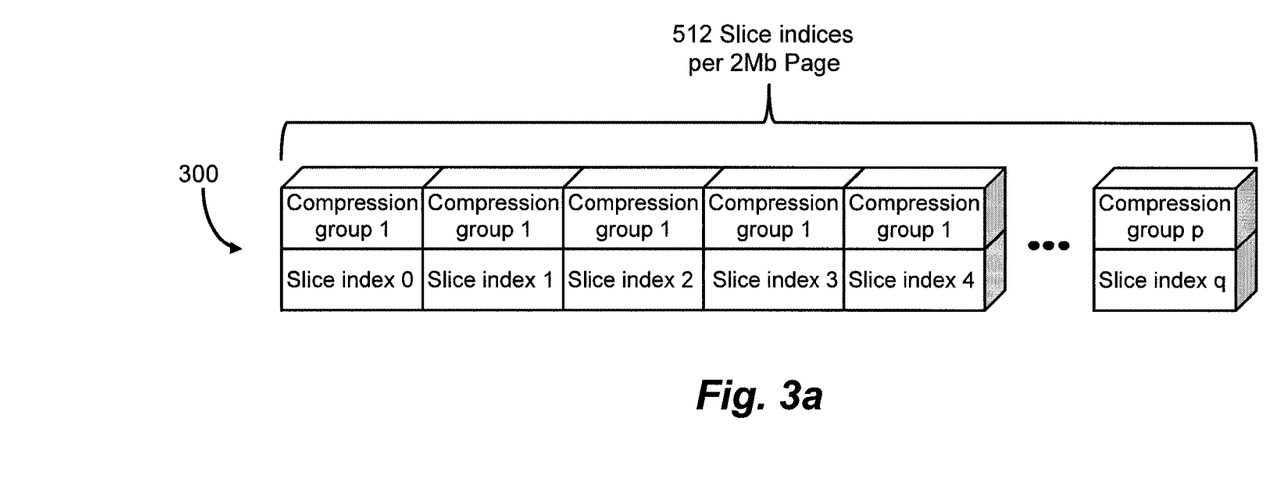
FIG. 3a is a diagram of an exemplary metadata map that represents relationships between a plurality of data slice indices and a plurality of compression group identifiers.

FIG. 3a depicts an exemplary metadata map 300 that represents relationships between a plurality of data slice indices (specified by integer values 0, 1, 2, 3, 4, . . . , q) and a plurality of compression group IDs (specified by integer values 1, . . . , p). As shown in FIG. 3a, the metadata map 300 represents relationships between (i) a slice index 0, a slice index 1, a slice index 2, a slice index 3, a slice index 4, and so on up to a slice index q, and (ii) a compression group 1 and so on up to a compression group p. For example, the slice index 0, the slice index 1, the slice index 2, the slice index 3, and the slice index 4 may correspond to the data slice A 201, the data slice B 202, the data slice C 203, the data slice D 205, and the data slice E 208, respectively. Further, the compression group 1 may correspond to the compression group ID of the compression group 128. In the metadata map 300, the slice indices 0, 1, 2, 3, 4 are configured to point to locations within the compression group 128 (identified by the compression group 1; see FIG. 3a) where the respective deduplicated data slices A 201, B 202, C 203, D 205, and E 208 reside.

It was noted herein that the data storage system 104 may be configured as a page-based storage system, and that the data stream 200 may include at least a page of data. As shown in FIG. 3a, such a page-based system can be configured to operate on a page containing 2 megabytes (Mb) of data, or any other suitable amount of data. Further, each compression group (e.g., the compression group 128) can be configured to include up to 16 data slices or any other suitable number of data slices, and each data slice can contain 4 kb of data or any other suitable amount of data.

Figure 3B:
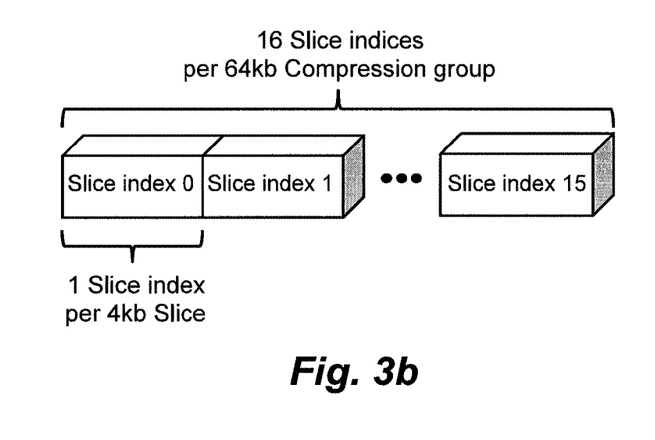
FIG. 3b is a diagram that represents relationships between a plurality of data slice indices within a compression group.

FIG. 3b depicts exemplary relationships between sixteen (16) slice indices 0, 1, 2, . . . , 15 and a compression group, such as the compression group 128. As described herein, each data slice can contain 4 kb of data, and each compression group can be configured to include up to sixteen 4 kb data slices. In FIG. 3b, each slice index 0, 1, 2, . . . , 15 can correspond to a 4 kb data slice, and the compression group can therefore contain 16×4 kb or 64 kb of data. As further described herein, a page-based system can be configured to operate on a page containing 2 Mb of data. The metadata map 300 of FIG. 3a can therefore represent relationships between (i) 512 slice indices 0, 1, 2, 3, 4, . . . , q per 512×4 kb or 2 Mb page, and (ii) a predetermined number of compression group IDs, such as compression group 1, . . . , compression group p. It is noted that a metadata map like the metadata map 300 can be used to facilitate decompression of the compressed group of deduplicated data slices 124 stored on the data storage resource(s) 118, for subsequent assembly and reconstruction of the data stream 200.

Figure 4:
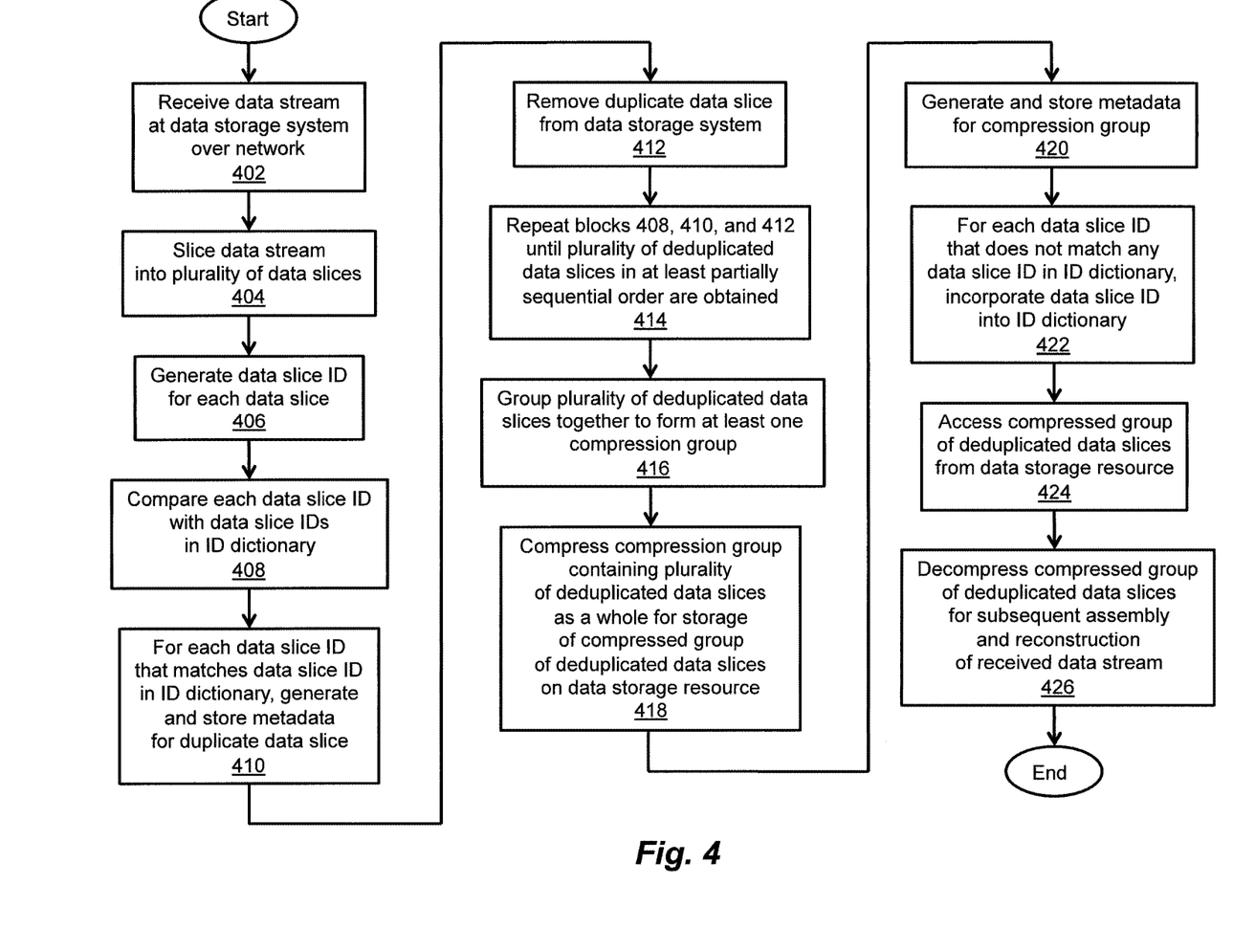
FIG. 4 is a flow diagram of an exemplary method of data deduplication and compression that can be performed by the data storage system of FIG. 1.

An exemplary method of data deduplication and compression that can be performed by the data storage system 104 of FIG. 1 is described below with reference to FIG. 4. As depicted in block 402, a data stream is received at the data storage system 104 over the network 106. As depicted in block 404, the data stream is sliced into a plurality of data slices. As depicted in block 406, a data slice ID is generated for each of the plurality of data slices. As depicted in block 408, each data slice ID is compared with one or more data slice IDs in the ID dictionary 116. As depicted in block 410, for each data slice ID that matches a data slice ID in the ID dictionary 126 (i.e., the data slice ID corresponds to a data slice that is a duplicate of a previously stored data slice), metadata (e.g., the data slice ID, a reference to the previously stored data slice, a data slice index pointing to a location of the duplicate data slice in the data stream) is generated and stored for the duplicate data slice. As depicted in block 412, the duplicate data slice is removed from the data storage system 104. As depicted in block 414, blocks 408, 410, and 412 are repeated until a plurality of deduplicated data slices in at least partially sequential order are obtained.

As depicted in block 416, the plurality of deduplicated data slices are grouped together to form at least one compression group, such as the compression group 128. As depicted in block 418, the compression group 128 containing the plurality of deduplicated data slices is compressed as a whole for storage of the compressed group of deduplicated data slices 124 on the spinning media of the data storage resource(s) 118. As depicted in block 420, metadata (e.g., the metadata map 300) is generated and stored for the compressed group of deduplicated data slices 124. As depicted in block 422, for each data slice ID that does not match any data slice ID in the ID dictionary 126, the data slice ID is incorporated into the ID dictionary 126. As depicted in block 424, the compressed group of deduplicated data slices 124 is accessed from the data storage resource(s) 118. As depicted in block 426, the compressed group of deduplicated data slices 124 is decompressed for subsequent assembly and reconstruction of the received data stream. It is noted that, because the compression group containing the plurality of deduplicated data slices is compressed and stored on the spinning media of the data storage resource(s) 118 in at least partially sequential order, the entire compressed group 124 of deduplicated data slices can be accessed from the data storage resource(s) 118 with a single IO request while minimizing a seek time and/or rotational latency of the spinning media.

Having described the foregoing illustrative embodiments, other alternative embodiments and/or variations can be made and/or practiced. For example, it was described herein that the data storage system 104 can be configured as a page-based system, and that the data stream 200 can include at least a page of data having a number of data blocks in sequential LBA order. In certain embodiments, the data storage system 104 can be configured as a log-based system, or any other suitable system. Because, in the log-based system, a data stream can include a number of data blocks that are not necessarily in sequential LBA order, an out-of-band operation may be performed during data deduplication to regain the sequential LBA nature of the data. As described herein, by storing deduplicated data slices as a compressed group on the data storage resource(s) 118 of the storage device array 110, a sequential nature of the deduplicated data segments in the compressed group can be more easily preserved to reduce a seek time and/or rotational latency of the data storage resource(s) 118, as well as reduce a number of IOPS handled by the data storage system 104 while accessing the respective data segments from the data storage resource(s) 118.

It was further described herein that compression group IDs and data slice indices can be used to track deduplicated data slices concatenated (or grouped together) within respective compression groups. In certain embodiments, such compression group IDs and data slice indices can be used to track compression groups relative to a full page of data, or one or more partial pages of data within the full page of data. Further, metadata (e.g., the metadata map 300) associated with the compression groups can include information to facilitate such tracking of the respective compression groups relative to a full page or one or more partial pages of data. It is noted that at least some deduplicated data slices grouped together within a compression group can be obtained from the same page of data, or from different pages of data.

It was further described herein that, in a page-based system, each compression group (e.g., the compression group 128) can be configured to include up to sixteen (16) deduplicated data slices, in which each deduplicated data slice contains 4 kb of data, allowing the compression group to contain 16×4 kb or 64 kb of data. In certain embodiments, such a compression group can contain more or less than 64 kb of data. For example, in the page-based system, having formed multiple compression groups containing 64 kb of data from deduplicated data slices on a single page, a remaining number of deduplicated data slices on the single page may constitute less than 64 kb of data. In this case, a final compression group for the single page can be configured to include less than sixteen (16) deduplicated data slices, i.e., less than 64 kb of data. In this way, the complexity of forming multiple compression groups of deduplicated data slices from a single page of data can be reduced.

It was further described herein that the memory 116 of the storage processor 108 can maintain, in association with the deduplication engine 120, the ID dictionary 126 for at least one deduplication domain. In certain embodiments, the ID dictionary 126 can dictate a cache domain of the data storage system 104. Such a cache domain can be configured for an in-line implementation and/or a post-process implementation of the disclosed data deduplication and compression techniques. For example, in a post-process implementation, the memory 116 may include a daemon application, which may be executed as a background process by the storage processor 108. During its execution, the background process may access a data stream stored on the data storage resource(s) 118, stage the data of the data stream into cache memory, and perform the disclosed data deduplication and data compression techniques on the staged data of the data stream. Further, an in-line implementation may be combined with the post-process implementation, allowing the storage processor 108 to initially perform at least data deduplication operations in an in-line fashion as the data stream is received at the data storage system 104, and to perform further data deduplication operations, as well as data compression operations, in a post-process fashion after the deduplicated data of the data stream has been stored on the data storage resource(s) 118 of the storage device array 110. An in-line implementation of the disclosed data deduplication and compression techniques may also be performed alone, separate from a post-process implementation of the disclosed techniques. For example, in such an in-line implementation, the storage processor 108 may, in an in-line fashion, (i) perform data deduplication operations as the data stream is received at the data storage system 104, (ii) stage a fixed or variable number of deduplicated data slices in a cache memory buffer to form a compression group, and (iii) perform data compression operations on the compression group in the cache memory buffer. Such an in-line implementation of the disclosed techniques may be repeated as desired, while avoiding the need to perform further data deduplication and/or compression operations in a post-process fashion.

It was further described herein that the storage processor 108 can slice the data stream 200 into a plurality of data slices, such as data slices A 201, B 202, C 203, A 204, D 205, B 206, C 207, E 208, which, in turn, can be subjected to data deduplication operations to obtain a plurality of deduplicated data slices, such as deduplicated data slices A 201, B 202, C 203, D 205, E 208. In certain embodiments, the deduplicated data slices A 201, B 202, C 203, D 205, E 208 can form either a single compression group or multiple compression groups. For example, the deduplicated data slices A 201, B 202, C 203 can be grouped together to form a first compression group, and the deduplicated data slices D 205, E 208 can be grouped together to form a second compression group. The size of each compression group can therefore be fixed or variable. Other combinations of the plurality of deduplicated data slices A 201, B 202, C 203, D 205, E 208 can also be grouped together to form multiple compression groups, preferably so long as a sequential nature of the deduplicated data slices is preserved in each compression group.

In the data deduplication and compression techniques described herein, not only can the size of each compression group be fixed or variable, but the size of each data segment or slice can also be fixed or variable. For example, in the data storage system 104 configured as a log-based system, a data stream can include a plurality of data slices having variable lengths. Further, a metadata map can be generated and stored, specifying locations at which the variable-length data slices begin and end within each compression group. In addition, in the data storage system 104 configured as a page-based system, a data stream can include a plurality of data slices having fixed lengths. Further, one or more compression groups having fixed lengths can be formed from the fixed-length data slices, and a metadata map can be generated and stored, specifying the fixed length of the compression groups, as well as the fixed length of the data slices. Locations of the fixed-length data slices within each compression group can then be determined from the known fixed sizes of the compression group and the respective data slices.

It is noted that the disclosed systems and methods or portions thereof may be embodied as a computer program product including one or more non-transient, computer-readable storage media, such as a magnetic disk, magnetic tape, compact disk, DVD, optical disk, flash drive, solid state drive (SSD), secure digital (SD) chip or device, application specific integrated circuit (ASIC), field programmable gate array (FPGA), and/or the like. Any number of computer-readable media may be used. The media may be encoded with instructions that, when executed on one or more computers or processors, perform the methods and/or operations described herein. Such media may be considered articles of manufacture or machines, and may be transportable from one machine to another.

While various illustrative embodiments of the disclosed system and method have been particularly shown and described herein, it will be understood by those skilled in the art that various changes in form and details may be made therein without departing from the scope of the disclosed system and method, as defined by the appended claims.

What is claimed is:

1. A method of data deduplication and compression in a data storage system including a data storage resource, comprising:
   obtaining a data stream including a plurality of data slices;
   performing, on a slice-by-slice basis, a data deduplication operation on the plurality of data slices to obtain a plurality of deduplicated data slices;
   grouping the plurality of deduplicated data slices to form a plurality of compression groups, each of the plurality of compression groups corresponding to an uncompressed group of deduplicated data slices;
   performing a data compression operation on each of the plurality of compression groups as a whole to obtain a plurality of compressed groups of deduplicated data slices;
   storing the plurality of compressed groups of deduplicated data slices on the data storage resource;
   performing at least the data deduplication operation in an in-line fashion as the data stream including the plurality of data slices is being obtained; and
   having performed at least the data deduplication operation in the in-line fashion, performing a background process comprising:
   obtaining the deduplicated data slices;
   performing, on a slice-by-slice basis, a second data deduplication operation on the plurality of deduplicated data slices to obtain a second plurality of deduplicated data slices;
   grouping the second plurality of deduplicated data slices to form a plurality of second compression groups, each of the plurality of second compression groups corresponding to an uncompressed group of deduplicated data slices;
   performing a second data compression operation on each of the plurality of second compression groups as a whole to obtain a plurality of second compressed groups of deduplicated data slices; and
   storing the plurality of second compressed groups of deduplicated data slices on the data storage resource.

2. The method of claim 1 further comprising:
   slicing the data stream into the plurality of data slices, the plurality of data slices including a plurality of fixed-length data slices.

3. The method of claim 2 wherein the performing of the data deduplication operation includes performing the data deduplication operation on the plurality of fixed-length data slices to obtain a plurality of fixed-length deduplicated data slices.

4. The method of claim 3 wherein the grouping of the plurality of deduplicated data slices includes grouping the plurality of fixed-length deduplicated data slices to form a plurality of fixed-length compression groups.

5. The method of claim 1 further comprising:
   slicing the data stream into the plurality of data slices, the plurality of data slices including a plurality of variable-length data slices.

6. The method of claim 5 wherein the performing of the data deduplication operation includes performing the data deduplication operation on the plurality of variable-length data slices to obtain a plurality of variable-length deduplicated data slices.

7. The method of claim 6 wherein the grouping of the plurality of deduplicated data slices includes grouping the plurality of variable-length deduplicated data slices to form a plurality of variable-length compression groups.

8. The method of claim 1 further comprising:
generating a metadata map that represents relationships between (i) a plurality of data slice indices for the plurality of deduplicated data slices, respectively, and (ii) a compression group identifier for each of the plurality of compression groups, the plurality of data slice indices pointing to locations within the plurality of compression groups where the plurality of deduplicated data slices reside.

9. The method of claim 1 further comprising:
performing the data deduplication operation and the data compression operation in an in-line fashion as the data stream including the plurality of data slices is being obtained.

10. The method of claim 9 wherein the performing of the data deduplication operation and the data compression operation in the in-line fashion comprises:
performing, in the in-line fashion:
(i) on a slice-by-slice basis, the data deduplication operation on the plurality of data slices to obtain a plurality of deduplicated data slices;
(ii) a staging operation to stage a fixed or variable number of the plurality of deduplicated data slices in a memory buffer to form each of the plurality of compression groups; and
(iii) the data compression operation on each of the plurality of compression groups as a whole in the memory buffer to obtain the plurality of compressed groups of deduplicated data slices.

11. A data storage system comprising:
a data storage resource;
a memory; and
a processor configured to execute instructions out of the memory:
to obtain a data stream including a plurality of data slices;
to perform, on a slice-by-slice basis, a data deduplication operation on the plurality of data slices to obtain a plurality of deduplicated data slices;
to group the plurality of deduplicated data slices to form a plurality of compression groups, each of the plurality of compression groups corresponding to an uncompressed group of deduplicated data slices;
to perform a data compression operation on each of the plurality of compression groups as a whole to obtain a plurality of compressed groups of deduplicated data slices;
to store the plurality of compressed groups of deduplicated data slices on the data storage resource;
to perform at least the data deduplication operation in an in-line fashion as the data stream including the plurality of data slices is being obtained; and
having performed at least the data deduplication operation in the in-line fashion, to perform a background process comprising:
obtaining the deduplicated data slices;
performing, on a slice-by-slice basis, a second data deduplication operation on the plurality of deduplicated data slices to obtain a second plurality of deduplicated data slices;
grouping the second plurality of deduplicated data slices to form a plurality of second compression groups, each of the plurality of second compression groups corresponding to an uncompressed group of deduplicated data slices;
performing a second data compression operation on each of the plurality of second compression groups as a whole to obtain a plurality of second compressed groups of deduplicated data slices; and
storing the plurality of second compressed groups of deduplicated data slices on the data storage resource.

12. The data storage system of claim 11 wherein the processor is further configured to execute the instructions out of the memory to slice the data stream into the plurality of data slices, wherein the plurality of data slices include a plurality of fixed-length data slices.

13. The data storage system of claim 12 wherein the processor is further configured to execute the instructions out of the memory to perform the data deduplication operation on the plurality of fixed-length data slices to obtain a plurality of fixed-length deduplicated data slices.

14. The data storage system of claim 13 wherein the processor is further configured to execute the instructions out of the memory to group the plurality of fixed-length deduplicated data slices to form a plurality of fixed-length compression groups.

15. The data storage system of claim 11 wherein the processor is further configured to execute the instructions out of the memory to slice the data stream into the plurality of data slices, wherein the plurality of data slices include a plurality of variable-length data slices.

16. The data storage system of claim 15 wherein the processor is further configured to execute the instructions out of the memory to perform the data deduplication operation on the plurality of variable-length data slices to obtain a plurality of variable-length deduplicated data slices, and to group the plurality of variable-length deduplicated data slices to form a plurality of variable-length compression groups.

17. The data storage system of claim 11 wherein the processor is further configured to execute the instructions out of the memory to generate a metadata map that represents relationships between (i) a plurality of data slice indices for the plurality of deduplicated data slices, respectively, and (ii) a compression group identifier for each of the plurality of compression groups, wherein the plurality of data slice indices point to locations within the plurality of compression groups where the plurality of deduplicated data slices reside.

18. A computer program product having a non-transitory computer readable medium that stores a set of instructions to perform data deduplication and compression in a data storage system that includes a data storage resource, the set of instructions, when carried out by computerized circuitry, causing the computerized circuitry to perform a method of:
obtaining a data stream including a plurality of data slices;
performing, on a slice-by-slice basis, a data deduplication operation on the plurality of data slices to obtain a plurality of deduplicated data slices;
grouping the plurality of deduplicated data slices to form a plurality of compression groups, each of the plurality of compression groups corresponding to an uncompressed group of deduplicated data slices;
performing a data compression operation on each of the plurality of compression groups as a whole to obtain a plurality of compressed groups of deduplicated data slices;

storing the plurality of compressed groups of deduplicated data slices on the data storage resource performing at least the data deduplication operation in an in-line fashion as the data stream including the plurality of data slices is being obtained; and having performed at least the data deduplication operation in the in-line fashion, performing a background process comprising:

obtaining the deduplicated data slices;

performing, on a slice-by-slice basis, a second data deduplication operation on the plurality of deduplicated data slices to obtain a second plurality of deduplicated data slices;

grouping the second plurality of deduplicated data slices to form a plurality of second compression groups, each of the plurality of second compression groups corresponding to an uncompressed group of deduplicated data slices;

performing a second data compression operation on each of the plurality of second compression groups as a whole to obtain a plurality of second compressed groups of deduplicated data slices; and storing the plurality of second compressed groups of deduplicated data slices on the data storage resource.

* * * * *